(12) United States Patent
Melik-Martirosian et al.

(10) Patent No.: US 8,957,472 B2
(45) Date of Patent: Feb. 17, 2015

(54) MEMORY DEVICE HAVING TRAPEZOIDAL BITLINES AND METHOD OF FABRICATING SAME

(75) Inventors: Ashot Melik-Martirosian, Sunnyvale, CA (US); Mark T. Ramsbey, Sunnyvale, CA (US); Mark W. Randolph, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/357,252

(22) Filed: Jan. 24, 2012

(65) Prior Publication Data

US 2012/0122285 A1    May 17, 2012

Related U.S. Application Data

(62) Division of application No. 11/033,588, filed on Jan. 12, 2005, now Pat. No. 8,125,018.

(51) Int. Cl.
*H01L 29/792* (2006.01)
*H01L 27/115* (2006.01)
*H01L 29/66* (2006.01)

(52) U.S. Cl.
CPC .......... *H01L 29/7923* (2013.01); *H01L 27/115* (2013.01); *H01L 27/11568* (2013.01); *H01L 29/66833* (2013.01)
USPC .................. 257/324; 257/E29.309; 438/287; 438/288

(58) Field of Classification Search
CPC ...................... H01L 29/7923; H01L 29/66833
USPC .................. 257/324, E29.309; 438/287, 288
See application file for complete search history.

(56) References Cited

U.S. PATENT DOCUMENTS

| | | | |
|---|---|---|---|
| 5,038,183 A * | 8/1991 | Kishi et al. | 257/51 |
| 6,133,605 A | 10/2000 | Kishi | |
| 6,686,242 B2 | 2/2004 | Willer et al. | |
| 6,812,139 B2 * | 11/2004 | Givens et al. | 438/637 |
| 2001/0041434 A1 | 11/2001 | Nakamura | |
| 2003/0198086 A1 | 10/2003 | Shukuri | |
| 2004/0191989 A1 | 9/2004 | Ngo et al. | |
| 2005/0214191 A1 * | 9/2005 | Mueller et al. | 423/339 |
| 2006/0145192 A1 * | 7/2006 | Van Duuren et al. | 257/202 |
| 2006/0203562 A1 * | 9/2006 | Ogura et al. | 365/185.28 |

OTHER PUBLICATIONS

International Search Report and Written Opinion for International Application No. PCT/US2006/001318 dated May 29, 2006.

* cited by examiner

*Primary Examiner* — Amar Movva

(57) ABSTRACT

A memory device and a method of fabrication are provided. The memory device includes a semiconductor substrate and a charge trapping dielectric stack disposed over the semiconductor substrate. A gate electrode is disposed over the charge trapping dielectric stack, where the gate electrode electrically defines a channel within a portion of the semiconductor substrate. The memory device includes a pair of bitlines, where the bitlines have a lower portion and a substantially trapezoidal shaped upper portion.

20 Claims, 5 Drawing Sheets

MEMORY DEVICE HAVING TRAPEZOIDAL BITLINES AND METHOD OF FABRICATING SAME

CROSS-REFERENCES TO RELATED APPLICATIONS

This application is a Divisional Application of and claims priority to U.S. patent application Ser. No. 11/033,588, filed on Jan. 12, 2005, titled "MEMORY DEVICE HAVING TRAPAZOIDAL BITLINES AND METHOD OF FSBRICATING SAME, " by Melik-Martirosian, et al, which is herein incorporated by reference.

TECHNICAL FIELD

The present invention relates generally to the field of non-volatile memory devices and, more particularly, to a charge trapping dielectric flash electrically erasable and programmable memory device having trapezoidal bitlines.

BACKGROUND

A pervasive trend in modern integrated circuit manufacture is to downscale memory devices so as to increase the amount of data stored per unit area on an integrated circuit memory device, such as a flash memory device. Memory devices often include a relatively large number of core memory devices (sometimes referred to as core memory cells). For instance, a conventional dual cell memory device, such as a charge trapping dielectric flash memory device, is capable of storing two bits of data in a double-bit arrangement. That is, one bit can be stored using a first charge storing region on a first side of the memory device and a second bit can be stored using a second charge storing region on a second side of the memory device.

As shown in FIG. 1, a conventional charge trapping dielectric memory device 10 includes a pair of buried bitlines 12 disposed within a semiconductor substrate 14. A charge trapping dielectric stack, which typically includes a non-conductive charge trapping layer 20 disposed between a bottom dielectric layer 22 and a top dielectric layer 24, is disposed over the semiconductor substrate 14. The charge trapping layer 20 typically includes a pair of charge storing regions on opposite sides of the layer. Over the top dielectric layer 24 is a gate electrode 26. In such a configuration, the buried bitlines function as a source (i.e., a source of electrons or holes) and a drain with an active channel region defined therebetween. Each memory device can be programmed, read and erased by applying appropriate voltages to the source, drain and gate electrode.

Where possible, it is desirable to downscale such memory devices, while still maintaining desirable qualities, such as adequate data retention, and optimizing performance. However, memory device downscaling can result in a number of performance degrading effects. This is especially true when the width (i.e., the lateral dimension) of the gate electrode is comparable to the width of the buried bitlines. Such a memory device is not efficient from a channel length scaling point of view. In other words, the channel length and effective channel length end up being relatively short. Memory devices having a relatively short channel length can experience a number of undesirable electrical characteristics referred to as short channel effects (SCE). SCE generally occur when the gate electrode does not have adequate control over the active channel region. As the physical dimensions of the device decrease, SCE can become more severe.

In view of the foregoing, there is a need in the art for improved memory devices, such as charge trapping dielectric flash memory devices, that optimize scale and performance.

SUMMARY OF THE INVENTION

According to one aspect of the invention, the invention is directed to a memory device. The memory device can include a semiconductor substrate; a charge trapping dielectric stack disposed over the semiconductor substrate; a gate electrode disposed over the charge trapping dielectric stack, the gate electrode electrically defining a channel within a portion of the semiconductor substrate; and a pair of bitlines, the bitlines having a lower portion and a substantially trapezoidal shaped upper portion.

According to another aspect of the invention, the invention is directed to a method of fabricating a memory device. The method can include providing a semiconductor substrate; forming a charge trapping dielectric stack over the semiconductor substrate; forming a gate electrode over the charge trapping dielectric stack; and forming a pair of bitlines on opposite sides of the charge trapping dielectric stack and gate electrode, the bitlines having a substantially trapezoidal upper portion.

BRIEF DESCRIPTION OF DRAWINGS

These and further features of the present invention will be apparent with reference to the following description and drawings, wherein.

DISCLOSURE OF INVENTION

Figure 1:
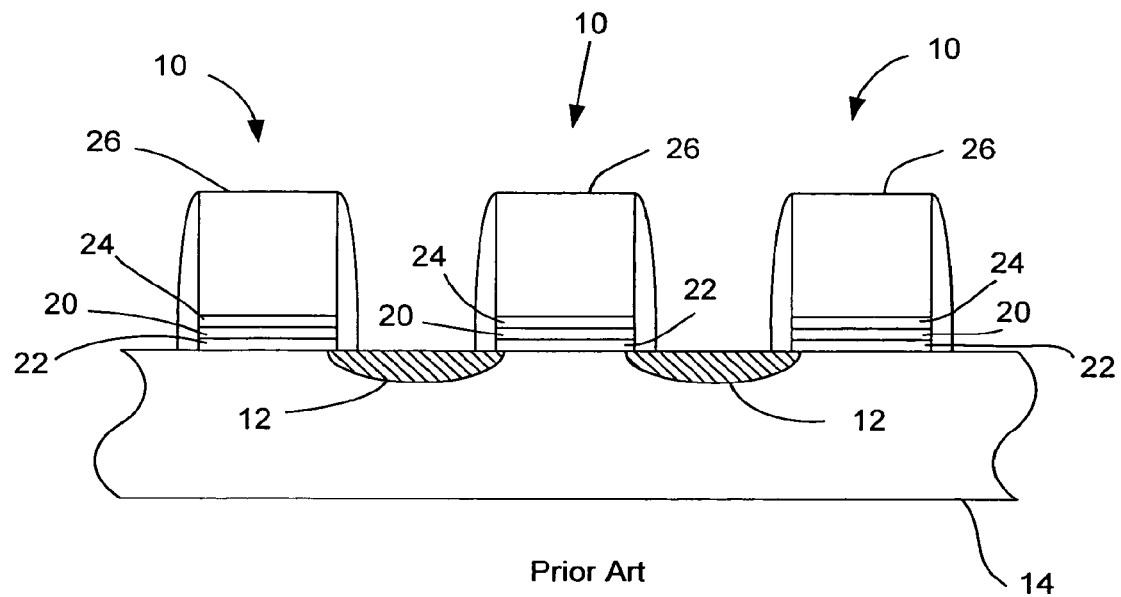
FIG. 1 is a schematic cross-section illustration of a conventional flash memory device.

In the detailed description that follows, like components have been given the same reference numerals regardless of whether they are shown in different embodiments of the present invention. To illustrate the present invention in a clear and concise manner, the drawings may not necessarily be to scale and certain features may be shown in somewhat schematic form.

Figure 2:
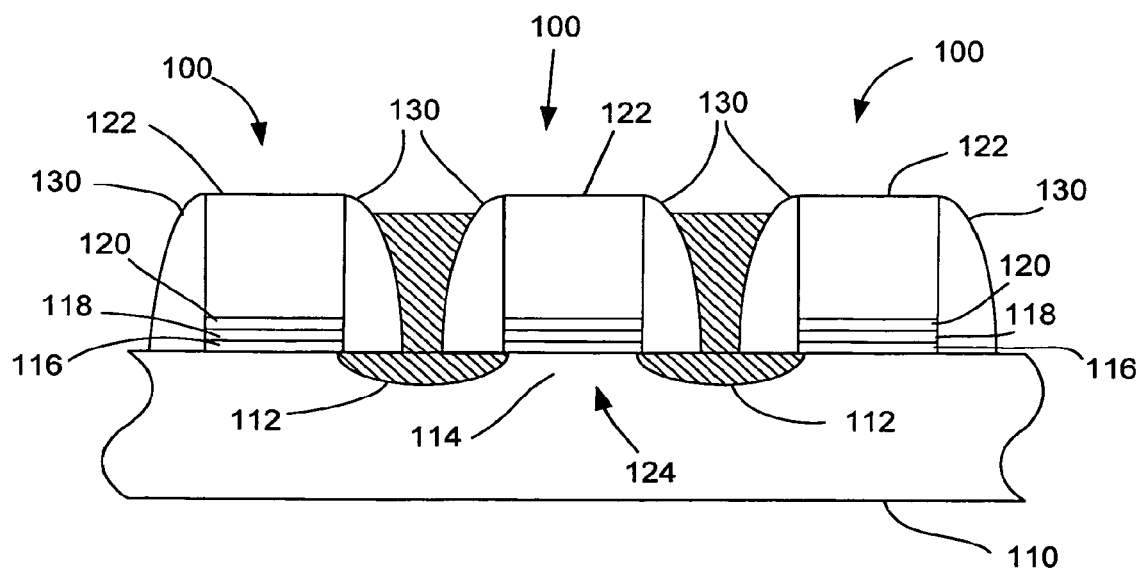
FIG. 2 is a schematic cross-section illustration of a flash memory device having raised trapezoidal bitlines in accordance with an exemplary embodiment of the present invention.

Referring to the drawings wherein like reference numerals designate like parts in the several figures, and initially to FIG. 2, an exemplary multiple-bit, charge trapping dielectric, non-volatile, flash electrically erasable and programmable memory device generally is illustrated at 100. The memory device 100 includes a semiconductor substrate 110. In one embodiment, the substrate 110 can initially be doped to have P-type conductivity (e.g., P dopant concentration). As is discussed more fully below, a pair of bitlines 112 can be formed partially within the substrate 110 and partially above the substrate, where the portion of each bitline 112 that is above the substrate 110 can have a substantially trapezoidal shape.

In one embodiment, each bitline 112 functions as a source and a drain, respectively, during various programming, reading, and erasing operations.

A body 114 is formed between the source and the drain. The body 114 can have the same dopant type and concentration as the initial doping of the substrate 110. As is described more fully below, the substrate 110, a portion of the source, a portion of the drain and the body 114 can be formed, for example, from a semiconductor, such as appropriately doped silicon, germanium or silicon-germanium.

Above the body 114 is a first dielectric layer 116 (sometimes referred to as a tunneling dielectric layer or a bottom dielectric layer) that is made from, for example, silicon oxide (e.g., $SiO_2$), other standard-K material (e.g., material having a relative permittivity below ten) or a high-K material (e.g., material having a relative permittivity, in one embodiment, above ten and, in another embodiment, above twenty).

Over the bottom dielectric layer 116 is a charge trapping layer 118 (also referred to as a charge storing layer). The charge trapping layer 118 can be made from, for example, a non-conductive material, including silicon nitride (e.g., $Si_3N_4$), silicon oxide with buried polysilicon islands, implanted oxide and the like.

Over the charge trapping layer 118 is another dielectric layer 120 (also referred to as a top dielectric layer) made from a material such as, for example, silicon oxide, other standard-K material or a high-K material. The first dielectric layer 116, the charge trapping layer 118 and the second dielectric layer 120 can be referred to as a dielectric stack or a charge trapping dielectric stack. It is to be appreciated that the dielectric stack can include greater than or fewer than three dielectric or non-conductive layers without departing from the scope of the present invention.

Figure 3:
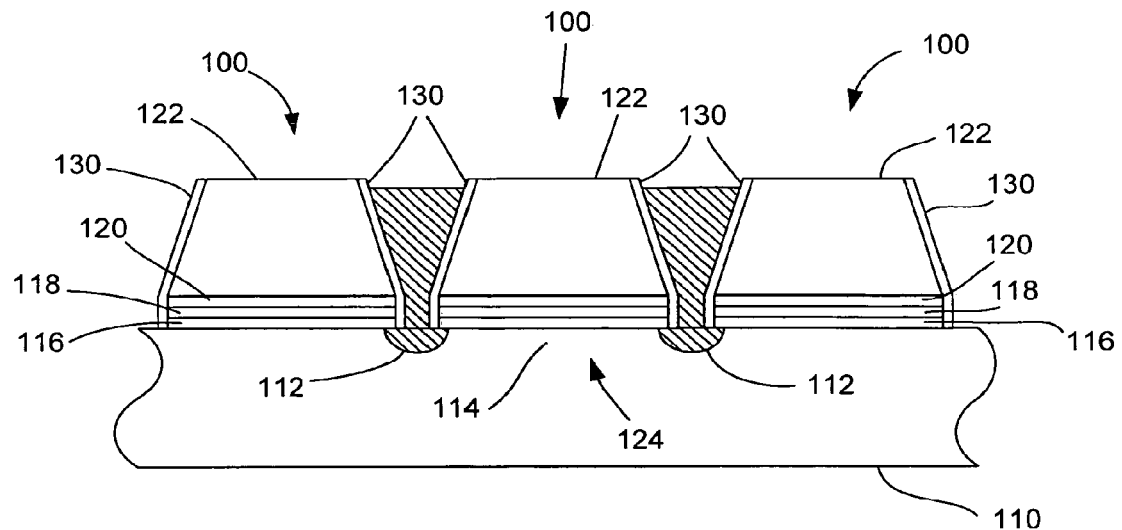
FIG. 3 is a schematic cross-section illustration of a flash memory device having raised trapezoidal bitlines in accordance with another exemplary embodiment of the present invention.

Over the second dielectric layer 120 is a gate electrode 122. The gate electrode 122 can be made from, for example, polycrystalline silicon (also referred to simply as poly) or another appropriate material, such as a metal or metal oxide. In one embodiment, such as is illustrated in FIG. 2, the gate electrode can be substantially rectangular in shape. Alternatively (as illustrated in FIG. 3), the gate electrode 122 can be substantially trapezoidal in shape. A work function of the gate electrode 122 controls a channel 124 (e.g., inversion or depletion states) within the body 114.

As illustrated, a pair of liners 130 (also referred to as sidewall spacers) can be disposed adjacent lateral sidewalls of the gate electrode 122 and the charge trapping dielectric stack (e.g., the top dielectric layer 120, the charge trapping layer 118 and the bottom dielectric layer 116). As will be described in greater detail below, the liners 130, in addition to providing electrical insulation between the bitlines 112 (e.g., the substantially trapezoidal upper portions of the bitlines) and the adjacent gate electrodes 122, can be used in the formation of the bitlines. The liners 130 (e.g., as illustrated in FIG. 2) can have a shape and geometry that aid in the formation of bitlines 112 having a substantially trapezoidal upper portion. For example, the liners 130 illustrated in FIG. 2 have a non-uniform thickness and a substantially half-trapezoidal shape, such that adjacent liners define a substantially trapezoidal bitline opening.

As used herein, "substantially trapezoidal" can include shapes or geometries having at least one pair of substantially parallel sides (regardless of whether the other two sides include straight lines, curved lines or otherwise). Further, as used herein, "upper portion" of a bitline can include the portion of each bitline 112 disposed above a vertical height where the bottom dielectric layer 116 meets the substrate 110. Conversely, the "lower portion" of a bitline can include the portion of each bitline 112 disposed below a vertical height where the bottom dielectric layer 116 meets the substrate 110 (e.g., within a portion of the substrate).

As illustrated, the bitlines 112 can include a buried lower portion and a substantially trapezoidal upper portion. In the exemplary embodiment illustrated in FIG. 2, the substantially trapezoidal upper portion of each bitline is formed with the assistance of the semi-trapezoidal liners 130. As is discussed more fully below, the upper portion of each bitline 112 can be made of a number of materials in order to achieve a bitline resistance at or below a predetermined value. For example, the upper portion of each bitline can be made of a metal, metal containing compound and/or appropriately doped semiconductor material, such as silicon. In one embodiment, the upper portion of each bitline can be made of a silicide, such as cobalt silicide or nickel silicide. Alternatively, each bitline 112 can be made from epitaxially grown silicon, which is doped in situ, for example, with phosphorus or arsenic. In another alternative embodiment, the upper portion of each bitline 112 can be made from a metal fill, such as a tungsten fill, or from a poly fill, which is doped in situ or by implantation with phosphorus or arsenic.

In another exemplary embodiment (illustrated in FIG. 3), each bitline 112 includes a buried lower portion as well as a substantially trapezoidal upper portion. In this embodiment, as is described more fully below, the gate electrode 122 is patterned to be substantially trapezoidal in shape. In this embodiment, the liners are substantially uniform in thickness and disposed adjacent the lateral side walls of the substantially trapezoidal gate electrode and the charge trapping dielectric stack. As shown, adjacent liners 130 define a substantially trapezoidal bitline opening, which can be used to form the substantially trapezoidal upper portion of each bitline. As described above with respect to FIG. 2, the upper portion of each bitline can be made of a metal, metal containing compound and/or appropriately doped semiconductor material, such as silicon.

Figure 7A:
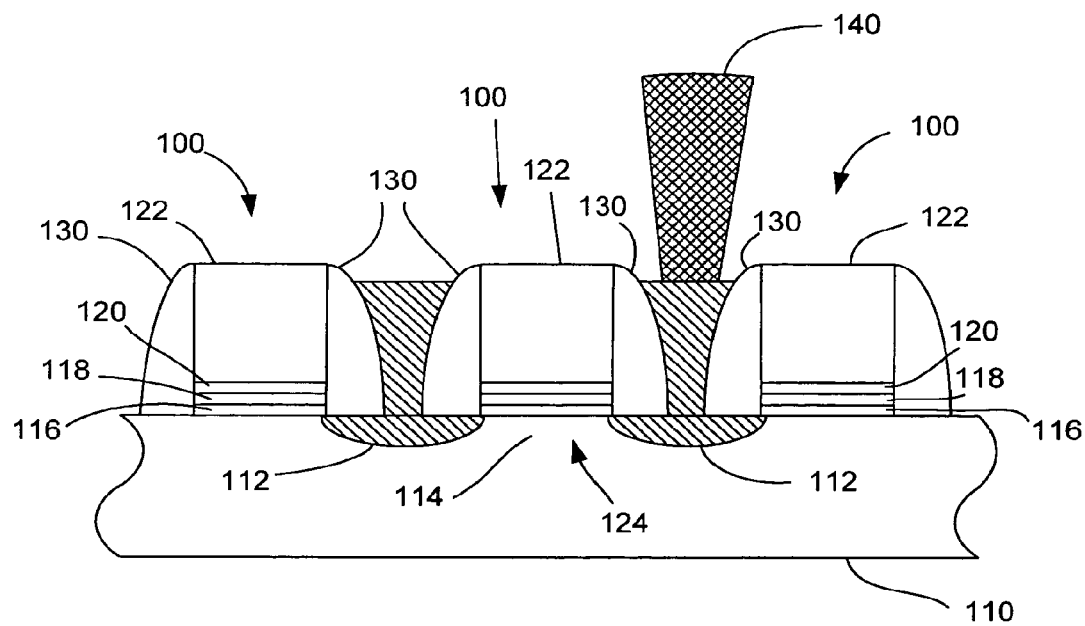
Figure 7B:
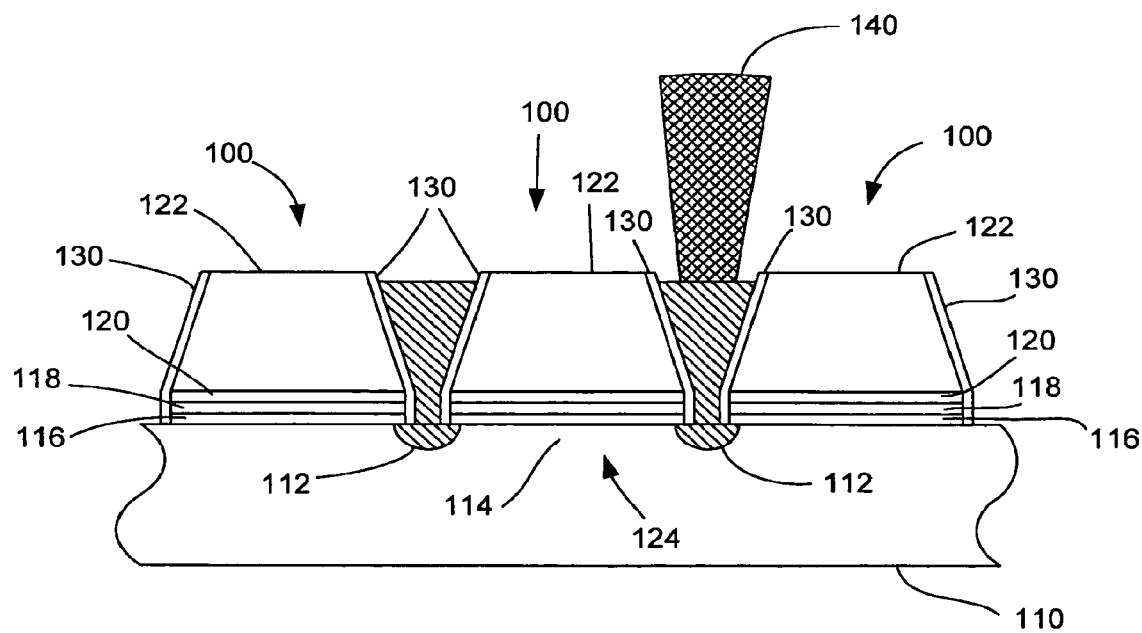

It is to be appreciated that the use of bitlines having a substantially trapezoidal upper portion can improve the scalability of, for example, double-bit charge trapping dielectric flash memory devices. For example, having a wider upper portion of the bitline reduces the need for contact scaling by providing a wider area with which to make contact. For example, the upper surface of the upper portion of each substantially trapezoidal bitline is larger enough to facilitate easy electrical communication with a contact 140, as is shown in FIGS. 7A and 7B. Further, as is shown, for example, in FIG. 3, a greater effective channel length can be achieved. A greater effective channel 124 length can provide improved charge separation in double-bit or multi-bit memory cells, a reduction in complimentary bit disturb effects, as well as improved short channel characteristics. This greater effective channel 124 length can be accomplished due to a decreased lateral dimension for the lower portion (e.g., the portion within the semiconductor substrate) of each bitline.

In one exemplary embodiment, the lower portion of each bitline can have a lateral dimension that is about 15% to about 30% of the length of the channel. Stated differently, in an exemplary embodiment (e.g., an exemplary technology node) including array of memory devices (such as those illustrated in FIG. 3) having a pitch of about 200 nm, the lower portion of each bitline can have a lateral dimension that is about 10% to about 20% of the pitch.

While, for purposes of simplicity of explanation, the methodologies depicted in FIGS. 4-7 are shown and described as a series of steps, it is to be understood and appreciated that the present invention is not limited to the order of steps, as some steps may, in accordance with the present invention, occur in different orders and/or concurrently with other steps from that shown and described herein. Moreover, not all illustrated steps may be required to implement a methodology in accordance with an aspect of the invention. Furthermore, additional steps can be added to the fabrication techniques described herein.

In the following description, which is provided with reference to FIGS. 4-7, analogous process steps are described together. For example, a method of fabricating the device illustrated in FIG. 2 is described with reference to FIGS. 4, 5A, 6A and 7A, while a method of fabricating the device illustrated in FIG. 3 is described with reference to FIGS. 4, 5B, 6B and 7B.

Figure 4:
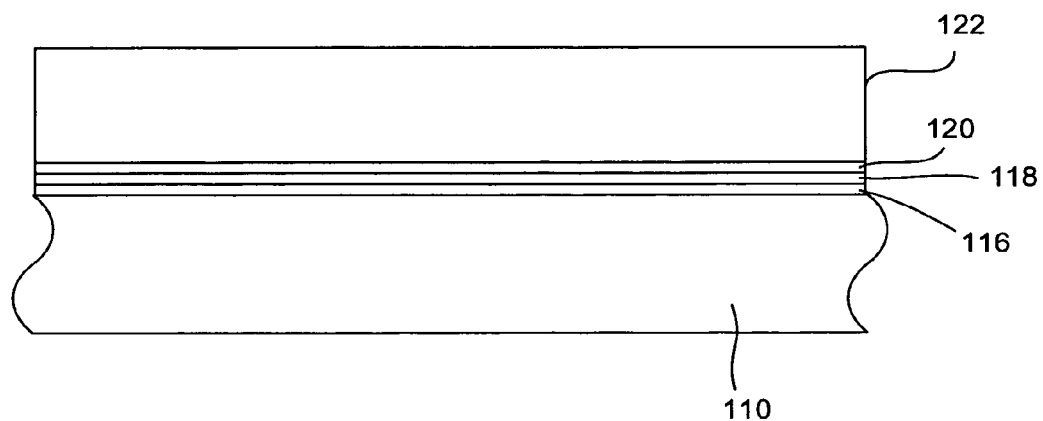
FIGS. 4-7 illustrate side cross-sectional views depicting fabricating steps in accordance with two exemplary embodiment of the present invention.

Referring now to FIG. 4, exemplary methods of fabricating two exemplary memory devices 100 are described in greater detail. As indicated, a semiconductor substrate 110 is provided. The semiconductor substrate 110 can be initially doped with P-type dopant, such as by implanting boron ions, gallium ions or indium ions. As indicated above, the initial substrate doping can provide the desired conductivity for a central portion of the body. In one embodiment, the initial substrate doping can have a "P" concentration, a "P+" concentration or a "P−" concentration. A layer of material used to form the first or bottom dielectric layer 116 can be grown or deposited on top of the substrate 110. It is noted that the bottom dielectric layer can optionally be used as an implant screen during the implantation of dopant species into the substrate 110. In this instance, the bottom dielectric layer can be formed before initial substrate implantation.

As indicated above, the bottom dielectric layer 116 can be formed from an appropriate dielectric material, such as a thermal oxide layer made from silicon oxide (e.g., $SiO_2$), or a high-K material. High-K materials are materials having, in one embodiment, a relative permittivity of ten or higher and, in another embodiment, of twenty or higher. Although other high-K materials can be selected, hafnium oxide (e.g., $HfO_2$), zirconium (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$), and barium strontium titanate (e.g., BST) are suitable high-K materials. In addition, all binary and ternary metal oxides and ferroelectric materials having a K higher than, in one embodiment, about twenty can be used for the bottom dielectric layer 116. The bottom dielectric layer can have a final thickness of, for example, about 40 angstroms to about 400 angstroms, depending upon the material used.

Following formation of the bottom dielectric layer 116, a layer of material used to form the charge trapping layer 118 can be formed on or over the bottom dielectric layer 116. In one embodiment, the charge trapping layer 118 can be formed from silicon nitride (e.g., $Si_3N_4$). Other suitable dielectric materials may also be used to form the charge trapping layer 118. In one exemplary embodiment, the charge trapping layer 118 can have a final thickness of about 20 angstroms to about 100 angstroms.

On top of or over the charge trapping layer, a second or top dielectric layer 120 can be formed. Similar to the bottom dielectric material layer, the top dielectric material layer can be made from an appropriate dielectric, such as silicon oxide or a high-K material. The top dielectric layer can have a thickness of about 20 angstroms to about 150 angstroms.

On top of over the top dielectric layer 120, a gate electrode layer 122 can be formed. The gate electrode layer 122 can be made from, for example, polycrystalline silicon (poly) or another appropriate material, such as a metal or metal oxide.

In one embodiment, the gate electrode 122 can have a thickness of, for example, about 500 angstroms to about 3000 angstroms.

The bottom dielectric layer 116, the charge trapping layer 118, the top dielectric layer 120 and the gate electrode layer 122 can be uniformly formed across the substrate 110 in an area used to form a core array of memory devices.

Figure 5A:
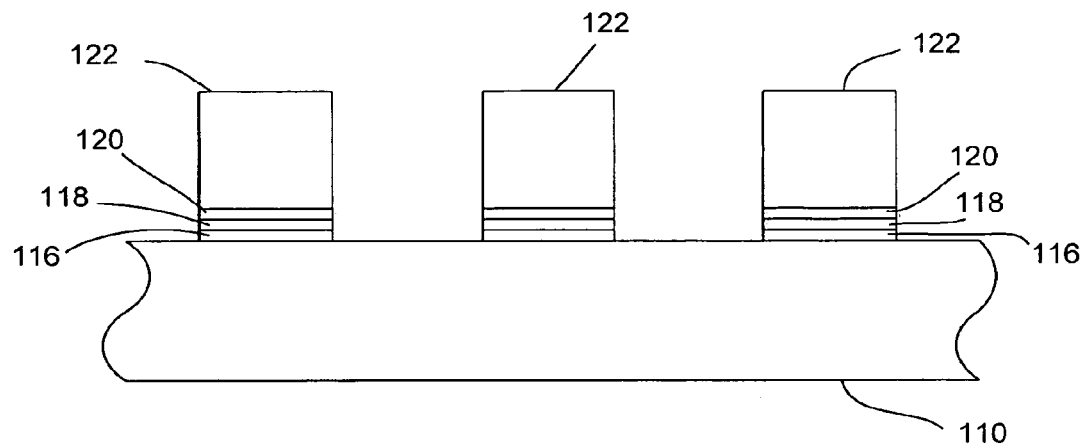
Figure 5B:
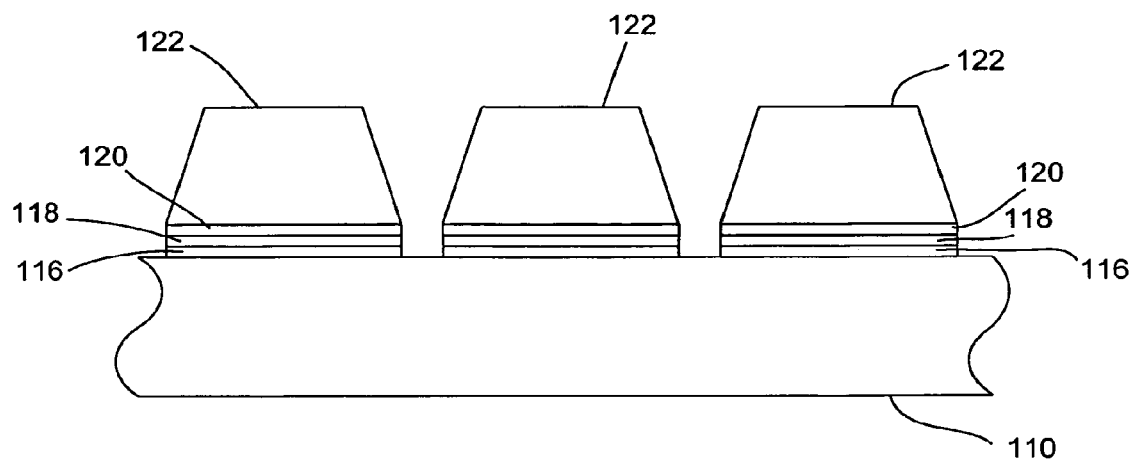

After the layers 116, 118, 120 and 122 have been formed, these layers can be patterned to form stacked gates, as shown in FIGS. 5A and 5B. This patterning step can include forming a mask layer from, for example, a photoresist that is patterned using photolithographic techniques. The mask layer can be patterned into a series of lines and spaces, where the lines cover the layers 116, 118, 120 and 122, where the stacked gates are formed, and the spaces expose the layers 116, 118, 120 and 122, where liners and the bitlines will be formed. The layers 116, 118, 120 and 122 can be etched in areas left exposed by the mask layer to expose the substrate 110. In the embodiment illustrated in FIG. 5B, the gate electrode layer 122 can be etched to provide a substantially trapezoidal shape for the gate electrode.

Figure 6A:
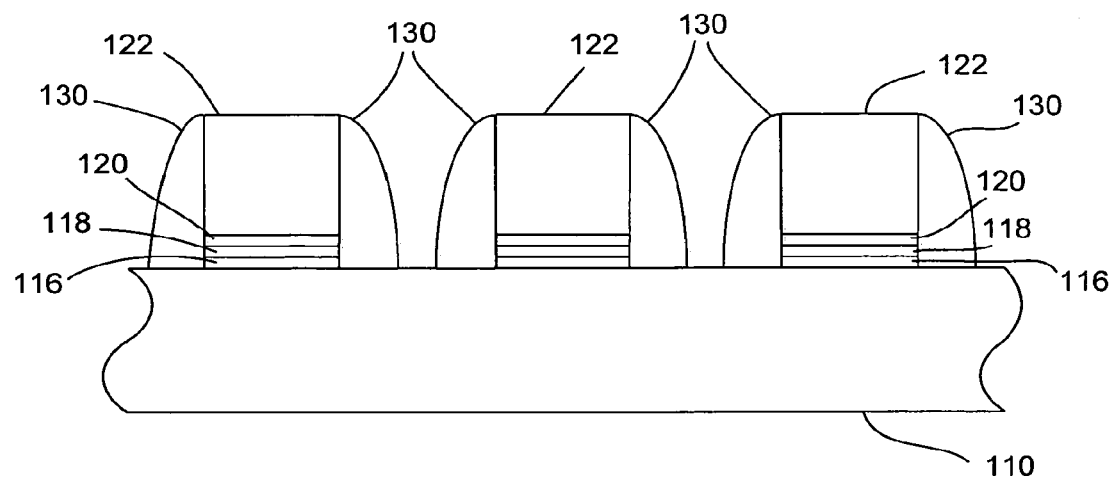
Figure 6B:
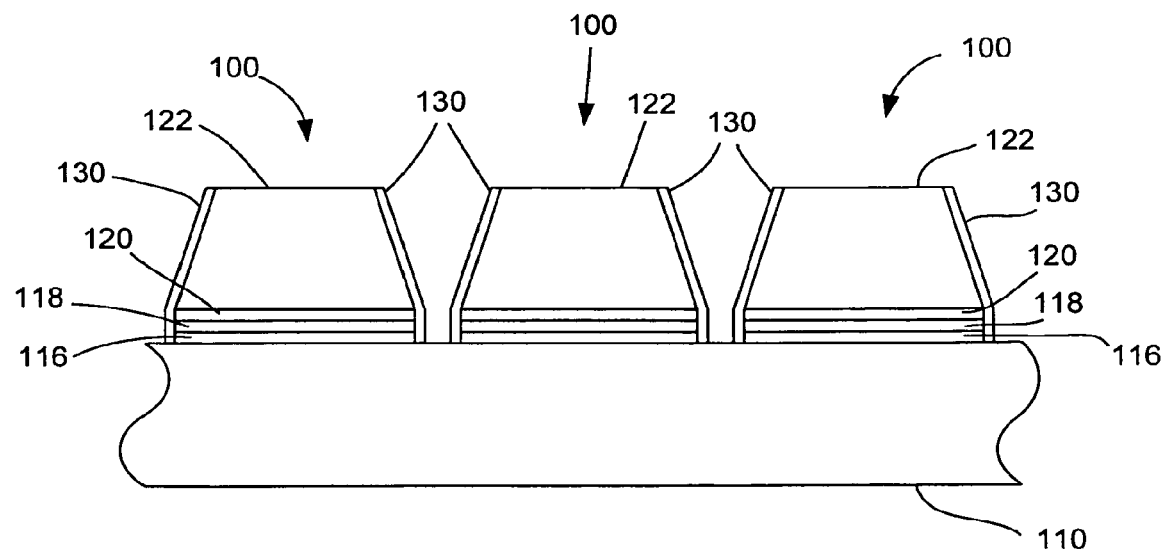

As shown in FIGS. 6A and 6B, once the patterning and/or etching process is complete, liners 130 can be formed. As shown in FIG. 6A, liners 130 having non-uniform thickness can be formed adjacent the lateral sidewalls of the charge trapping dielectric stack, made up of the bottom dielectric layer 116, the charge trapping layer 118, the top dielectric layer 120, and the gate electrode layer 122. In the illustrated exemplary embodiment, the liners 130 have a non-uniform thickness, such that, when two adjacent liners are formed, they define a substantially trapezoidal opening therebetween. These liners 130 can be formed using a variety of techniques. For example, a layer of desired spacer material (e.g., silicon nitride, silicon oxide, silicon oxynitride, etc.) can be deposited to at least the height of the gate electrode 122. If desired, the spacer material can be polished, using, for example, chemical mechanical planarization or CMP. Then, the liner material can be anisotropically etched so that the liners remain, as shown.

In the embodiment illustrated in FIG. 6A, the thickness of each liner 130 is non-uniform, such that the bottom portion of the liner (i.e., the portion of the liner nearest the substrate 110) has a greater thickness than the upper portion of the liner. In an exemplary embodiment, the bottom portion of each liner can have a lateral dimension of about 20 to 40 nanometers. Of course, liners having other lateral dimensions can be employed depending upon the desired technology node without departing from the scope of the present invention. This liner configuration serves to define a substantially trapezoidal bitline opening having a relatively narrow dimension adjacent the substrate and a relatively wider dimension adjacent the top portion of the gate electrodes. Such a liner configuration provides or otherwise defines a substantially trapezoidal bitline opening for formation of the substantially trapezoidal upper portion of each bitline.

In the embodiment illustrated in FIG. 6B, the thickness of each liner is substantially uniform. In an exemplary embodiment, the liners can have a thickness of, for example, about 15 nanometers to about 25 nanometers. Of course, liners having other thicknesses can be employed depending upon the desired technology node without departing from the scope of the present invention. Taken in connection with the substantially trapezoidal gate electrodes 122, this liner configuration serves to define a bitline opening having a relatively narrow dimension adjacent the substrate and a relatively wider dimension near the top portion. Such a liner and gate electrode configuration provides or otherwise defines a substantially trapezoidal bitline opening for formation of the upper portion of each bitline. In this exemplary embodiment, the liners 130 can be formed from an oxide or other suitable material via thin film deposition.

As shown in FIGS. 7A and 7B, once the liners 130 are formed, the bitlines 112 can be formed. As is described herein, the upper portion of each bitline 112 can be made of a metal, metal containing compound and/or appropriately doped semiconductor material, such as silicon. As discussed above, formation and patterning of the charge trapping dielectric stack, the gate electrode and the liners adjacent lateral side walls thereof, define substantially trapezoidal bitline openings between adjacent liners. The bitlines 112 can be formed using a variety of techniques, each producing or otherwise forming bitlines having a buried lower portion (e.g., a portion beneath the interface formed by the substrate 110 and the bottom dielectric layer 116) and a substantially trapezoidal upper portion formed above the interface between the substrate 110 and the bottom dielectric layer 116.

In one embodiment, the bitlines 112 are formed using a light bitline ion or dopant implant process through the bitline opening, defined by the adjacent liners 130, into the substrate 110. For example, the light bitline implant can be a light drain doping (LDD)-type doping, for example, using a phosphorus or arsenic ion species implanted at a dose of approximately $1 \times e^{14}$ atoms/cm$^2$. In this embodiment, the light bitline implant, can be followed by silicidation of the bitline, using, for example, cobalt, nickel or another suitable material, thereby forming a substantially trapezoidal upper bitline portion made, for example, of cobalt-silicide, nickel-silicide or another appropriate silicide. If desired, an anneal cycle (such as a rapid thermal anneal (RTA)) can be carried out to activate the dopant species. It is to be appreciated that the dopant species may diffuse under the liner and stacked gate during one or more subsequent anneal cycles to which the device is subjected. Any such diffusion can be accounted for or otherwise controlled by controlling the implant energy, the implant dose, the anneal cycle parameters, pre-amorphization parameters and the like.

In another embodiment, the bitlines can be formed by producing a layer of epitaxially grown silicon on top of and within the bitline opening, which is defined between adjacent liners 130, and performing in situ doping with an appropriate ion species, such as, for example, phosphorus or arsenic. It is to be appreciated that in this exemplary embodiment, a bitline implant (such as is described above) can be skipped if diffusion from the epitaxially grown bitline is sufficient to create the necessary gate-to-junction overlap within the substrate 110.

In another alternative embodiment, a light bitline implant, such as is described above, can be performed through the bitline opening into the substrate, followed by deposition of a thin titanium "glue layer" and an appropriate metal fill. In one embodiment, a tungsten fill can be performed to provide the substantially trapezoidal upper portion of the bitline. It is to be appreciated that each of the above-described bitline formation processes provides bitlines having buried bottom portions and substantially trapezoidal upper portions that have a sufficiently low resistance for efficient operation.

As discussed above, formation of bitlines having substantially trapezoidal upper portions facilitates introducing contacts 140 into electrical communication with the bitlines. For example, the wide and relatively accessible upper surface of each substantially trapezoidal bitline reduces the need for contact scaling. Thereafter, any additional processing to complete formation of the memory devices can be carried out. Such processing can include deposition of top oxide layers and interlayer dielectrics, formation of wordlines and suitable wordline contacts, any additional dielectric layers, conductive layers, interconnect layers, and the like.

As should be apparent, the foregoing methods can be modified as desired to form desired properties of the memory device. For instance, the order of steps can be modified, certain steps can be omitted and/or additional steps can be added. In addition, the specified materials, dopant parameters and so forth can be modified.

It should be noted that in interpreting the words "above", "over", and "on top of" in the specification and claims, these words are not intended to be restricted to directly above, directly over or directly on top of, but may include intervening layers between a layer described as being "above", "over", or "on top of" another layer or substrate. For example, the description of a first material above, over or on top of a substrate is not intended to exclude other layers being disposed therebetween.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of fabricating a memory device onto a semiconductor substrate, the method comprising:
    forming a charge trapping dielectric stack over the semiconductor substrate;
    forming a gate electrode over the charge trapping dielectric stack;
    forming a pair of liners adjacent to and in physical contact with lateral sidewalls of the charge trapping dielectric stack and the gate electrode, the pair of liners defining a pair of bitline openings; and
    forming a pair of bitlines through the pair of bitline openings on opposite sides of the charge trapping dielectric stack and gate electrode, the pair of bitlines having substantially trapezoidal upper portions and substantially rectangular middle portions above the substrate, and a curved portion below the substrate.

2. The method of claim 1, wherein forming the pair of bitlines comprises:
    forming a pair of the lower portions disposed within the semiconductor substrate for the pair of bitlines.

3. The method of claim 1, further comprising:
    patterning the charge trapping dielectric stack and the gate electrode.

4. The method of claim 3, wherein the patterning comprises:
    patterning the gate electrode to have a substantially trapezoidal shape, and wherein the forming the pair of liners comprises:

forming the pair of liners adjacent to the lateral sidewalls of the charge trapping dielectric stack and the substantially trapezoidal shape, the pair of liners defining a pair of substantially trapezoidal shaped bitline openings.

5. The method of claim 4, wherein each liner from among the pair of liners has a thickness of about 15 nanometers to about 25 nanometers.

6. The method of claim 3, wherein the patterning comprises:
patterning the gate electrode to have a substantially rectangular shape, and wherein the forming comprises:
forming the pair of liners of non-uniform thickness adjacent to the lateral sidewalls of the charge trapping dielectric stack and the substantially rectangular shape, the pair of liners defining a pair of substantially trapezoidal shaped bitline openings.

7. The method of claim 3, wherein the patterning comprises:
forming a first dielectric layer over the semiconductor substrate;
forming a charge trapping dielectric layer over the first dielectric layer; and
forming a second dielectric layer over the charge trapping dielectric layer.

8. The method of claim 1, wherein forming the pair of bitlines comprises:
performing a bitline implant through each bitline opening from among the pair of bitline openings; and
silicidating each bitline from among the pair of bitlines to form the substantially trapezoidal upper portion and the substantially rectangular middle portion.

9. The method of claim 1, wherein forming the pair of bitlines comprises:
performing a bitline implant through each bitline opening;
depositing a titanium glue layer within each bitline opening; and
performing a metal fill within each bitline opening to form the substantially trapezoidal upper portion and the substantially rectangular middle portion.

10. The method of claim 9, wherein the metal fill is a tungsten fill.

11. The method of claim 1, wherein forming the pair of bitlines comprises:
forming a layer of epitaxially grown silicon within each bitline opening; and
doping the epitaxially grown silicon in situ.

12. The method of claim 11 wherein the epitaxially grown silicon is doped in situ using phosphorus or arsenic.

13. The method of claim 11, further comprising:
before forming the layer of epitaxially grown silicon, performing a bitline implant through each bitline opening.

14. The method of claim 1, further comprising:
providing a contact in electrical communication with a top surface of the substantially trapezoidal portion of at least one bitline from among the pair of bitlines.

15. A method of fabricating a memory device onto a semiconductor substrate, the method comprising:

forming a charge trapping dielectric stack and a gate electrode onto the semiconductor substrate;
forming a pair of liners in physical contact with lateral sidewalls of the charge trapping dielectric stack and the gate electrode; and
forming a pair of bitlines in physical contact with the pair of liners on opposite sides of the charge trapping dielectric stack and gate electrode, wherein the pair of liners define shapes of the pair of bitlines, the pair of bitlines having a pair of lower portions disposed within the semiconductor substrate, and a pair of upper portions having substantially trapezoidal shapes, and a pair of middle portions having substantially rectangular shapes, wherein the pair of middle portions are in physical contact with the pair of lower portions.

16. The method of claim 15, further comprising:
patterning the charge trapping dielectric stack and the gate electrode.

17. The method of claim 16, wherein the patterning comprises:
forming a first dielectric layer over the semiconductor substrate;
forming a charge trapping dielectric layer over the first dielectric layer; and
forming a second dielectric layer over the charge trapping dielectric layer.

18. The method of claim 15, wherein the forming the pair of liners comprises:
forming the pair of liners adjacent to the lateral sidewalls of the charge trapping dielectric stack, the pair of liners defining a pair of substantially trapezoidal shaped bitline openings and a pair of substantially rectangular shaped bitline openings below the substantially trapezoidal shaped bitline openings.

19. The method of claim 15, wherein the forming the pair of liners comprises:
forming the pair of liners of non-uniform thickness adjacent to the lateral sidewalls of the charge trapping dielectric stack and a substantially rectangular shaped gate electrode, the pair of liners defining a pair of substantially trapezoidal shaped bitline openings.

20. A method of fabricating a memory device onto a semiconductor substrate, the method comprising:
forming a charge trapping dielectric stack and a gate electrode onto the semiconductor substrate;
forming a pair of liners in physical contact with lateral sidewalls of the charge trapping dielectric stack and the gate electrode, the pair of liners adjacent to the lateral sidewalls of the charge trapping dielectric stack, the pair of liners defining a pair of substantially trapezoidal shaped bitline openings and a pair of substantially rectangular shaped bitline openings below the substantially trapezoidal shaped bitline openings; and
forming a pair of bitlines in physical contact with the pair of liners on opposite sides of the charge trapping dielectric stack and gate electrode, wherein the pair of liners define shapes of the pair of bitlines.

* * * * *